(12) United States Patent
Lin et al.

(10) Patent No.: US 9,111,818 B2
(45) Date of Patent: Aug. 18, 2015

(54) PACKAGING SUBSTRATE

(71) Applicant: Unimicron Technology Corporation, Taoyuan (TW)

(72) Inventors: Chun-Ting Lin, Taoyuan (TW); Yu-Chung Hsieh, Taoyuan (TW); Ying-Tung Wang, Taoyuan (TW); Ying-Chih Chan, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 14/018,757

(22) Filed: Sep. 5, 2013

(65) Prior Publication Data
US 2014/0182912 A1    Jul. 3, 2014

(30) Foreign Application Priority Data

Dec. 28, 2012    (TW) .............................. 101225514 U

(51) Int. Cl.
| | |
|---|---|
| H05K 7/10 | (2006.01) |
| H05K 7/12 | (2006.01) |
| H01L 23/00 | (2006.01) |
| H01L 23/498 | (2006.01) |
| H01L 21/48 | (2006.01) |
| H05K 3/40 | (2006.01) |

(52) U.S. Cl.
CPC ............ *H01L 24/13* (2013.01); *H01L 21/4853* (2013.01); *H01L 23/49811* (2013.01); *H01L 23/49816* (2013.01); *H01L 23/49838* (2013.01); *H01L 24/11* (2013.01); *H01L 24/16* (2013.01); *H01L 2224/1132* (2013.01); *H01L 2224/1161* (2013.01); *H01L 2224/11422* (2013.01); *H01L 2224/11462* (2013.01); *H01L 2224/11464* (2013.01); *H01L 2224/11622* (2013.01); *H01L 2224/11823* (2013.01); *H01L 2224/11825* (2013.01); *H01L 2224/131* (2013.01); *H01L 2224/13017* (2013.01); *H01L 2224/13019* (2013.01); *H01L 2224/13022* (2013.01); *H01L 2224/13026* (2013.01); *H01L 2224/1357* (2013.01); *H01L 2224/1369* (2013.01); *H01L 2224/13082* (2013.01); *H01L 2224/13147* (2013.01); *H01L 2224/13582* (2013.01); *H01L 2224/13583* (2013.01); *H01L 2224/13611* (2013.01); *H01L 2224/13644* (2013.01); *H01L 2224/13655* (2013.01); *H01L 2224/13664* (2013.01); *H01L 2224/16227* (2013.01); *H01L 2224/81192* (2013.01); *H05K 3/4007* (2013.01)

(58) Field of Classification Search
USPC .......................................... 361/767; 174/261
See application file for complete search history.

(56) References Cited

U.S. PATENT DOCUMENTS

2008/0253097 A1* 10/2008 Kawano ........................ 361/766

* cited by examiner

*Primary Examiner* — Andargie M Aychillhum
(74) *Attorney, Agent, or Firm* — Mintz Levin Cohn Ferris Glovsky and Popeo, P.C.; Peter F. Corless; Steven M. Jensen

(57) ABSTRACT

A packaging substrate is provided, including a substrate body having a plurality of conductive pads, an insulating protective layer formed on the substrate body for the conductive pads to be exposed therefrom, and a plurality of conductive pillars disposed on the conductive pads. Each of the conductive pillars has a bottom end and a top end narrower than the bottom end, thereby forming a cone-shaped structure that does not have a wing structure. Therefore, the distance between contact points is reduced and the demands for fine-pitch and multi-joints are satisfied.

19 Claims, 11 Drawing Sheets

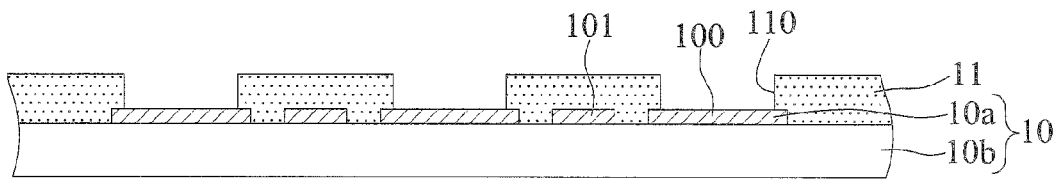
FIG.1A (PRIOR ART)
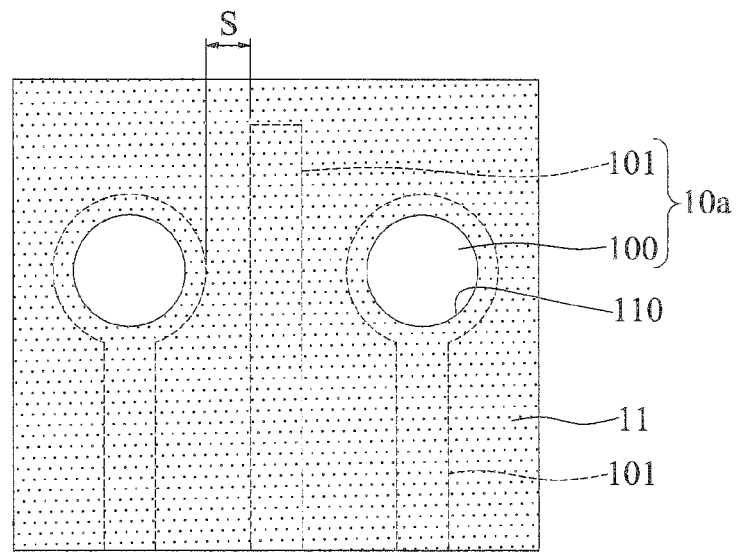
FIG.1A' (PRIOR ART)
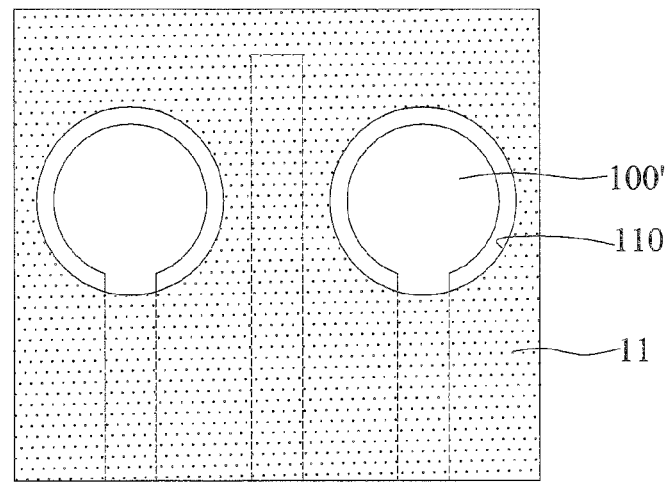
FIG.1A" (PRIOR ART)

FIG.2D"

PACKAGING SUBSTRATE

CROSS-REFERENCES TO RELATED APPLICATIONS

This application claims under 35 U.S.C. §119(a) the benefit of Taiwanese Application No. 101225514, filed Dec. 28, 2012, the entire contents of which is incorporated herein by reference.

BACKGROUND OF THE INVENTION

1. Field of the Invention

The present invention relates to packaging substrates, and, more particularly, to a packaging substrate having reliability improved.

2. Description of Related Art

With the development of electronic industry, electronic product designs have trended to be compact-sized and multiple-functioned, and semiconductor package technology has also developed different package types. In accordance to different package structure, different types of packaging substrate are also developed. A conventional flip-chip packaging substrate has a chip placement region on a surface of the substrate body, a plurality of conductive pads are disposed in the chip placement region, and a solder mask having a plurality of openings for exposing the conductive pads respectively is formed on the substrate body. During a packaging process, a semiconductor chip is placed in the chip placement region, and electrically connected to the conductive pads by a flip-chip method.

FIGS. 1A-1E are cross-sectional views illustrating a method for fabricating a packaging substrate 1 according to the prior art.

As shown in FIG. 1A, a substrate body 10 covered by an insulating protective layer 11 is provided, the substrate body 10 has a plurality of conductive pads 100 disposed on a surface thereof, and the insulating protective layer 11 is utilized as a solder mask and has a plurality of openings 110 such that a portion of end surfaces of the conductive pads 100 are exposed by the openings 110, causing the conductive pads 100 to be solder-mask-defined (SMD).

The substrate body 10 includes a dielectric layer 10b and a circuit layer 10a disposed on the dielectric layer 10b (as shown in FIG. 1A'). The circuit layer 10a has a plurality of conductive traces 101 and the conductive pads 100 connected to the conductive traces 101. The end surfaces of the conductive pads 100 are round, and the openings 110 are also round.

As shown in FIG. 1A", openings 110 of the insulating protective layer 11 can also expose all end surfaces of the conductive pads 100' such that the conductive pads 100' are non-solder-mask-defined.

FIG. 1B shows a subsequent process of FIGS. 1A and 1A'. A resist layer 12 is formed on the insulating protective layer 11, and has a plurality of openings 120 exposing the conductive pads 100 by exposure and development methods. A diameter w of the opening 120 is bigger than a diameter v of the opening 110.

As shown in FIG. 1C, copper bumps 13 are formed by electroplating on the openings 120 such that the conductive pads 100 are electrically connected to the copper bumps 13.

As shown in FIG. 1D, the resist layer 12 is removed.

As shown in FIG. 1E, a solder bump 15 is formed on the copper bump 13 to cover the copper bump 13.

In the structure of SMD of a conventional packaging substrate 1, since the alligining accuracy e of an exposing machine is, for example, less than or equal to 12.5 µm, as shown in FIG. 1B, the diameter w of an opening 120 of the resist layer 12 is bigger than a diameter v of an opening 110 of the insulating protective layer 11, resulting that the copper bump 13 forms a wing structure 130 (as shown in FIG. 1C). Therefore, a certain spacing P between the solder bumps 15 should be maintained to prevent a bridge connection (as shown in FIG. 1E), and the spacing P between the solder bumps 15 cannot be reduced to, for example, 130 µm or less, in order to satisfy demands for fine-pitch and multi-joints.

Moreover, in the conventional SMD, during the performance of Temperature Cycling Test (TCT), because of the great difference between the coefficients of thermal expansion (CTE) of the wing structure 130 and the insulating protective layer 11, the uneven thermal stress may easily cause a crack c at the insulating protective layer 11 under the wing structure 130, as shown in FIG. 1D. The crack c not only reduces the reliability of the packaging substrate 1, but also causes the failure of test for the packaging substrate 1.

Furthermore, because of the formation of the wing structure 130, the diameter v of the opening 110 is less than the greatest diameter of the copper bump 13 (as the diameter w of the wing structure 130) such that the diameter v of the opening 110 may not equal to the greatest diameter of the copper bump 13, as shown in FIG. 1D. Therefore, the reliability of the copper bump 13 cannot be enhanced so that a solder ball may be left off during the push-pull bond test for the solder bump 15.

In addition, in the conventional SMD, as shown in FIG. 1A', the spacing S between the conductive pad 100 and the conductive traces 101 directly effects the yield. If the spacing S is small, the yield of a circuit is low. However, in the conventional packaging substrate 1, the yield cannot be promoted due to the fact that the spacing S cannot be increased any further.

On the other hand, in the conventional NSMD, as shown in FIG. 1A", because the contact area between the circuit layer 10a' and the insulating protective layer 11 is small, compared with the conventional SND design, the bonding ability between the circuit layer 10a' and the dielectric layer 10b is worse.

Therefore, how to overcome the problems of the prior art is substantially an issue desirably to be solved in the art.

SUMMARY OF THE INVENTION

In view of the above-mentioned problems of the prior art, the present invention provides a packaging substrate, comprising: a substrate body having a plurality of conductive pads disposed on a surface thereof; an insulating protective layer formed on the surface of the substrate body and having openings for the conductive pads to be exposed therefrom; and conductive pillars disposed on end surfaces of the conductive pads exposed from the openings and having first ends and opposite second ends, therewith the first ends being closer than the second ends from the conductive pads, and the first ends having a width bigger than a width of the second ends.

In an embodiment, the openings are round, and each of the end surfaces of the conductive pads has a length and a width less than the length, and are oval or rectangular. By the shape of the end surface, a non-solder-mask-defined (NSMD) type is designed in the width direction of the end surface between the insulating protective layer and the conductive pad, and a solder-mask-defined (SMD) type is designed in the length direction of the end surface. That is, to replace a portion of a design of the conventional SMD with a design of the NSMD, so the spacing between the conductive pad and the conductive trace can be increased thereby to raise the density of wiring layout on the substrate body surface or therefore to promote the flexibility of wiring layout.

In an embodiment, the conductive pad is disposed on the surface of the substrate body or embedded in the substrate body to expose the end surface on the substrate body. The conductive pad is solder-mask-defined (SMD) or non-solder-mask-defined (NSMD). Alternatively, the end surface width is non-solder-mask-defined and the end surface length is solder-mask-defined. Therefore, in comparison with conventional NSMD design, the present invention covers the dielectric surface of the substrate body by forming the conductive pillars in the openings, and increases the bonding ability to the conductive pad.

In an embodiment, the conductive pad is located on the substrate body, the opening does not penetrate the insulating protective layer, and the bottom surface of the opening of the insulating protective layer is lower than or flush with the surface of the conductive pad.

In an embodiment, the first end of the conductive pillar is in contact with the conductive pad.

In an embodiment, the conductive pillar further has a seat body in the opening, and the seat body extends from the first end of the conductive pillar and is in contact with the conductive pad. The surface of the seat body is lower than or flush with the rim of the opening. The width of the seat body is bigger than, less than or equal to the width of the first end.

In an embodiment, the conductive pillar further has a lateral surface between the first end and the second end, and the lateral surface is a flat or arced.

In an embodiment, the packaging substrate further comprises metal pillars disposed on the substrate body and surrounding the conductive pillars, and the metal pillar has a first segment and a second segment. The first segment of the metal pillar and the conductive pillar have similar structures.

From the above, the packaging substrate according to the present invention has a conductive pillar, in which the first end is wider than the second end so that the conductive pillar does not form a wing structure, and therefore spacing between contacts can be decreased to satisfy the demands for fine-pitch and multi-joints.

Moreover, because the conductive pillar does not form a wing structure, there is no metal material on the insulating protective layer during the performance of temperature cycling test (TCT). The crack is therefore avoided to not only promote the reliability of the packaging substrate, but also allow the successful test of the packaging substrate.

Furthermore, the conductive pillar forms a cone-shaped structure so that the diameter of the opening is equal to the greatest diameter of the conductive pillar (as the first end). The reliability of the conductive pillar can therefore be enhanced to avoid a solder ball to be left off during the performance of the push-pull bond test.

In addition, the cone-shaped structure of the conductive pillar increases the surface areas such that that the adhesion areas between the conductive pillar and a solder material can be increased to enhance the bonding ability between the conductive pillar and a solder material.

BRIEF DESCRIPTION OF DRAWINGS

The invention can be more fully understood by reading the following detailed description of the preferred embodiments, with reference made to the accompanying drawings, wherein:

FIGS. 1A-1E are cross-sectional views of a method for fabricating a packaging substrate according to the prior art, wherein FIG. 1A' is a local top view of FIG. 1A, and FIG. 1A" is another pattern of FIG. 1A';

DETAILED DESCRIPTION OF THE INVENTION

The following illustrative embodiments are provided to illustrate the disclosure according to the present invention, these and other advantages and effects can be apparently understood by the in the art after reading the disclosure of this specification. The present invention can also be performed or applied by other different embodiments. The details of the specification may be on the basis of different points and applications, and numerous modifications and variations can be devised without departing from the spirit according to the present invention.

It should be advised that the structure, ratio, and size as illustrated in this context are only used for disclosures of this specification, provided for persons skilled in the art to understand and read, and technically do not have substantial meaning. Any modification of the structure, change of the ratio relation, or adjustment of the size should be involved in the scope of disclosures in this specification without influencing the producible efficacy and the achievable objective of this specification. Also, the referred terms such as "on", "under", "first", "second" and "one" in this specification are only for the convenience to describe, not for limiting the scope of embodiment in this invention. The changes or adjustments of relative relationship without substantial change of technical content should also be considered within the category of implementation.

FIGS. 2A-2F are cross-sectional views of a method for fabricating a packaging substrate according to the present invention.

Figure 1B:
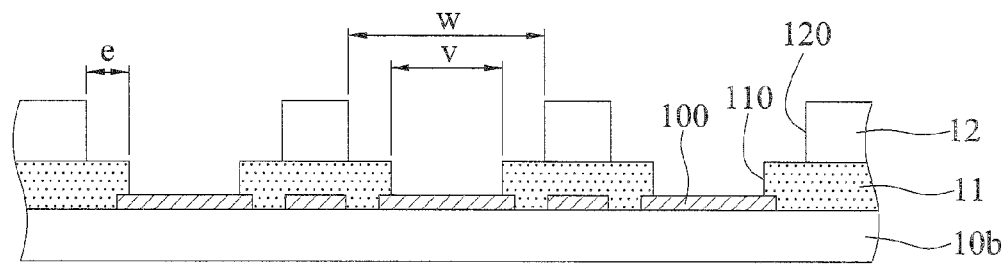
Figure 1C:
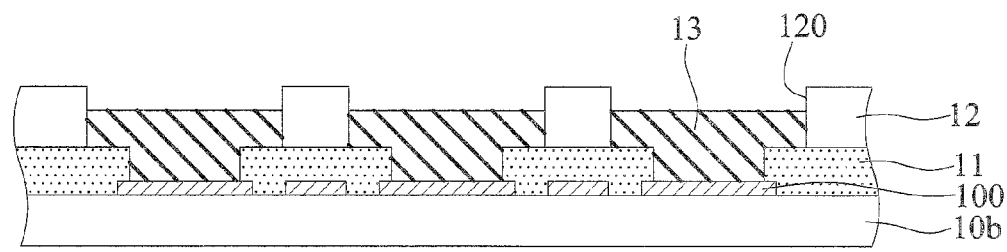
Figure 1D:
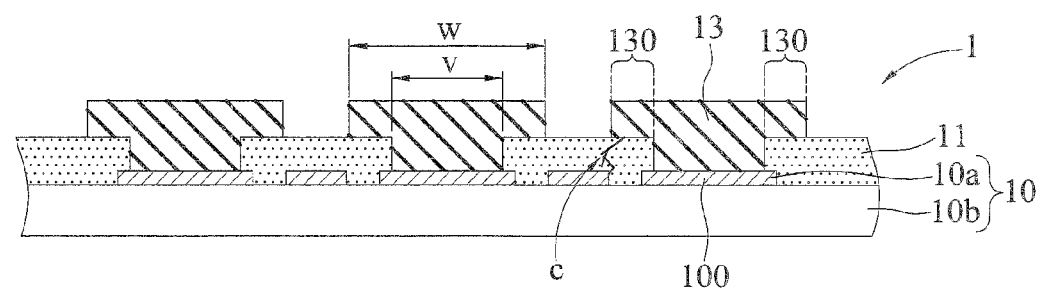
Figure 1E:
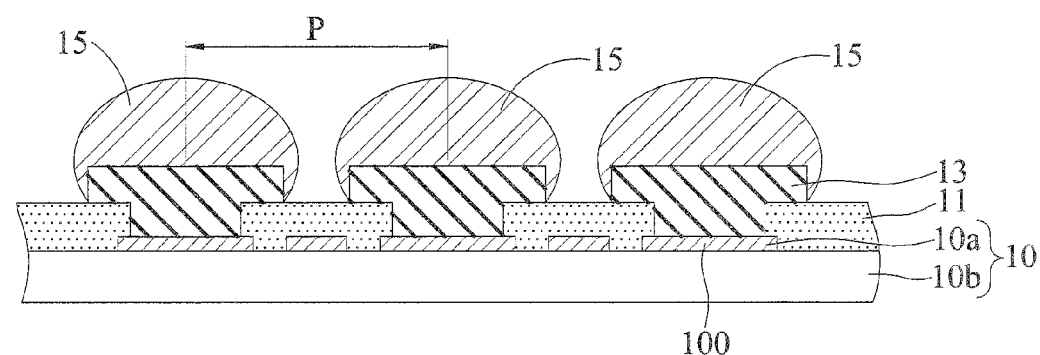
Figure 2A:
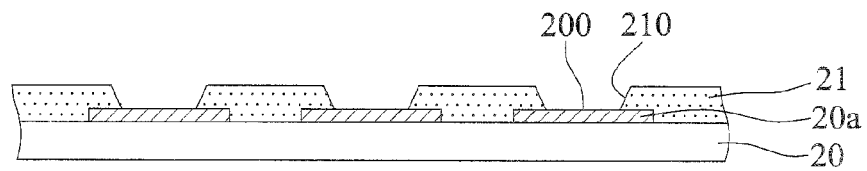
FIGS. 2A-2F are cross-sectional views of a method for fabricating a packaging substrate according the present invention, wherein FIG. 2A' is a local top view of another embodiment of FIG. 2A, FIGS. 2D' and 2D" are yet another embodiments of FIG. 2D, FIGS. 2E', 2F and 2F' are further another embodiments of FIG. 2E.
Figure 2A:
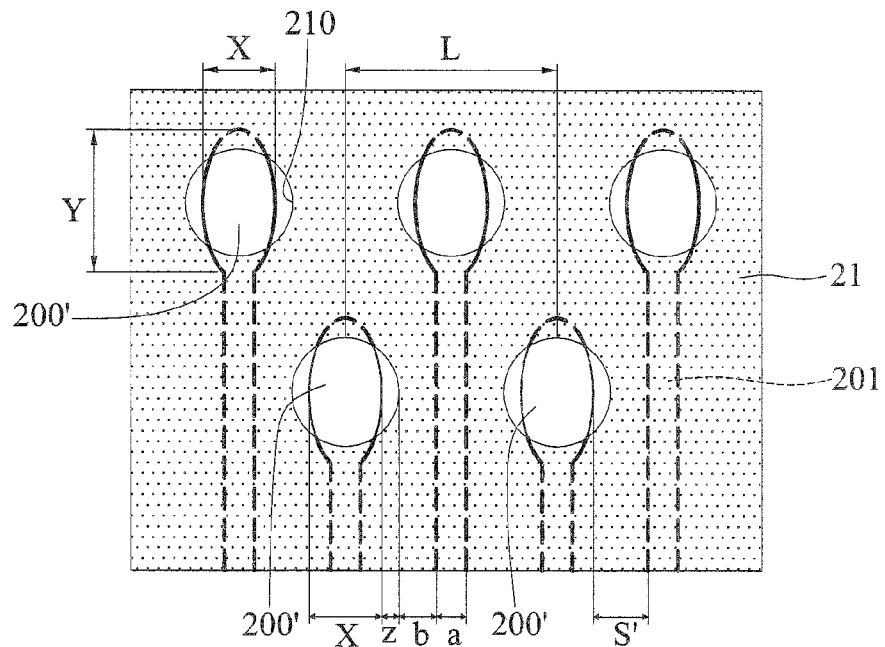

As shown in FIG. 2A, a substrate body 20 having a plurality of conductive pads 200 is provided, and an insulating protective layer 21 is formed on the surface of substrate body 20 and the conductive pads 200. The insulating protective layer 21 also has a plurality of openings such that a portion of end surfaces of the conductive pads 200 is exposed from the openings 210, causing the conductive pads 200 to be solder-mask-defined (SMD).

In an embodiment, the substrate body 20 has a dielectric layer, and a circuit layer 20a is formed on the dielectric layer. The circuit layer 20a has a plurality of conductive traces 201 (as shown in FIG. 2A') and the conductive pads 200 connected to the conductive traces 201. That is, the conductive pads 200 are disposed on the dielectric layer of the substrate body.

As shown in FIG. 2A, the end surface of the conductive pad 200 is round, and the opening 210 is also round.

In another embodiment, as shown in FIG. 2A', the length Y of the end surface is bigger than the width X of the end surface of the conductive pad 200' such that the end surface of the conductive pad 200' is preferably oval or rectangular (not illustrated).

Therefore, by the fact that the length Y of the end surface is bigger than the width X of the end surface of the conductive pad 200', a non-solder-mask-defined (NSMD) type is designed in the axial direction of the width X of the end surface, and a solder-mask-defined (SMD) type is designed in the direction of the length Y of the end surface. That is, to replace a portion of a design of the conventional SMD with a design of the NSMD, so the spacing S' between the conductive pad 200' and the conductive trace 201 can be increased to raise the density of wiring layout on the surface of the substrate body 20 or therefore to promote the flexibility of wiring layout.

As shown in FIG. 2A', the length Y of the end surface of the conductive pad 200' is, for example, 80 μm, the width X of the end surface is, for example, 40 μm, and the diameter of the opening 210 is, for example, 60 μm such that the spacing z between the conductive pad 200' and the opening 210 is, for example, 10 μm. The spacing b between the opening 210 and the conductive trace 201 is, for example, 13 μm, the trace width a of the conductive trace 201 is, for example, 14 μm, and the spacing between the conductive pads 200' is, for example, 100 μm.

Figure 2B:
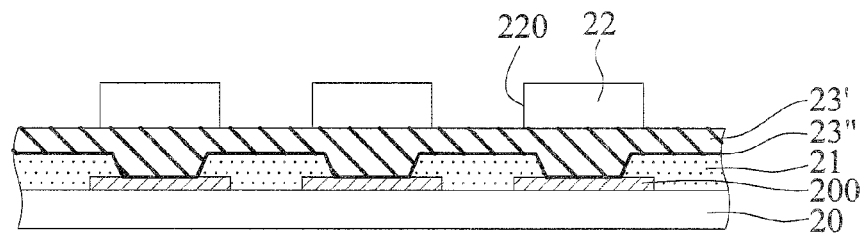

FIG. 2B shows a subsequent process of FIG. 2A. A conductive seedlayer 23" is formed on the insulating protective layer 21 and the conductive pads 200 to thereby form a metal layer 23' by electroplating.

Subsequently, a resist layer 22 is formed on the metal layer 23', and the resist layer 22 has a patterned open region 220 formed to expose the metal layer 23' such that the remaining resist layer 22 covers the metal layer 23' on the conductive pads 200.

In an embodiment, it is not limited to use a photo-resist layer, and is not limited by the lithography machine, so the limitation that alligning accuracy should be less than or equal to, for example, 12.5 μm may be eliminated.

Figure 2C:
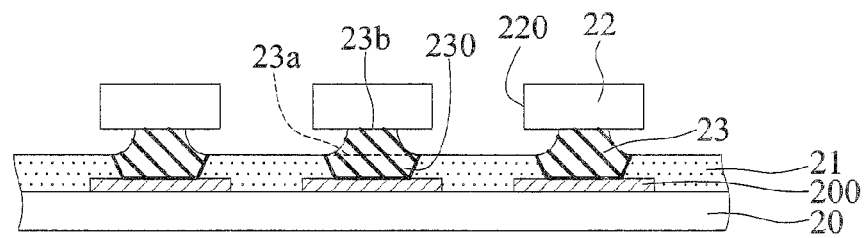

As shown in FIG. 2C, the metal layer 23' in the patterned open region 220 is removed by etching, and the remained metal layer 23' serves as the conductive pillar 23.

In an embodiment, the conductive pillar 23 is a copper pillar and disposed on the conductive pad 200, and the conductive pillar 23 has opposite first end 23a and second end 23b. The first end 23a is closer to the conductive pad 200 than the second end 23b.

Furthermore, the conductive pillar 23 further has a seat body 230 in the opening 210, and the seat body 230 is located between the conductive pad 200 and the first end 23a.

Figure 2D:
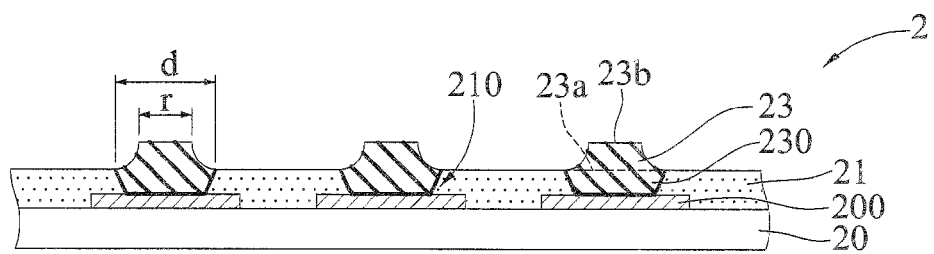
Figure 2D:
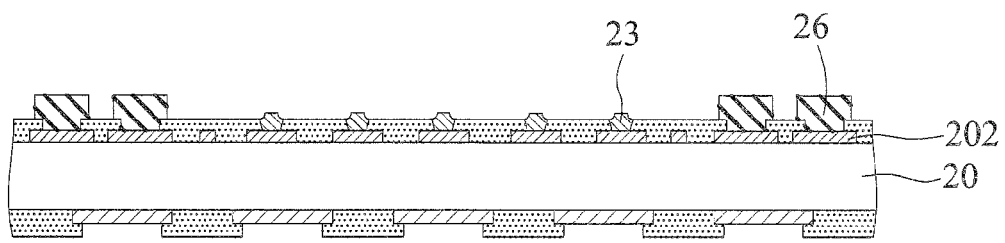

As shown in FIG. 2D, a resist layer 22 is removed to expose the second end 23b of the conductive pillar 23 provided for bonding a semiconductor chip (not illustrated).

In another embodiment, as shown in FIG. 2D', the periphery of the substrate body 20 further has a plurality of conductive pads 202, and correspondingly a plurality of metal pillars 26 such as copper pillars disposed on the conductive pads 202 to surround the conductive pillars, and thus provided to stack and bond a package (not illustrated) to form package on package (POP).

During the process of fabricating the metal pillars 26, the conductive pillars 23 may be formed first, and the metal pillars 26 are formed by electroplating. Alternatively, the conductive pillars 23 and the first segments 261 of the metal pillars 26' may be formed simultaneously, then the second segments 262 of the metal pillars 26' are formed thereafter, as shown in FIG. 2D". Therefore, the first segments 261 of the metal pillars 26' and the conductive pillars 23 have similar structures such as a cone-shaped structure.

Figure 2E:
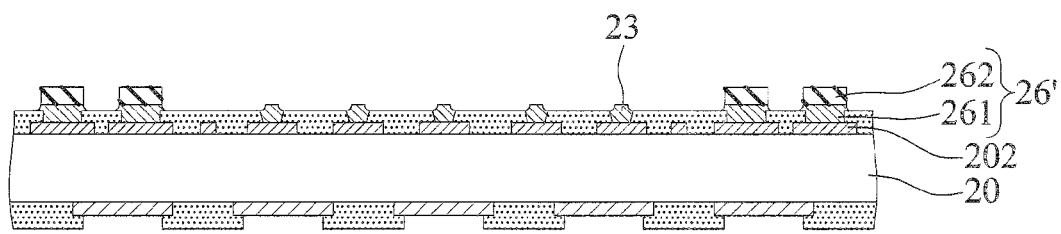
Figure 2E:
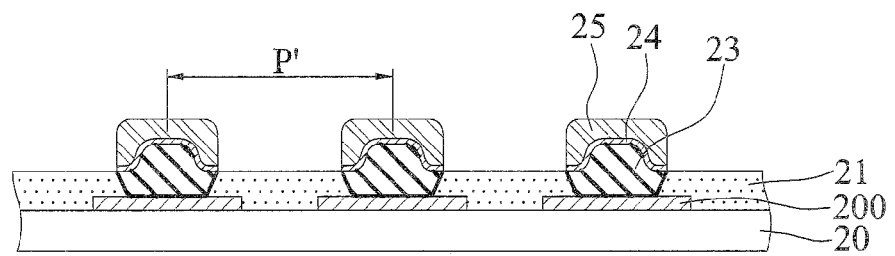
Figure 2E:
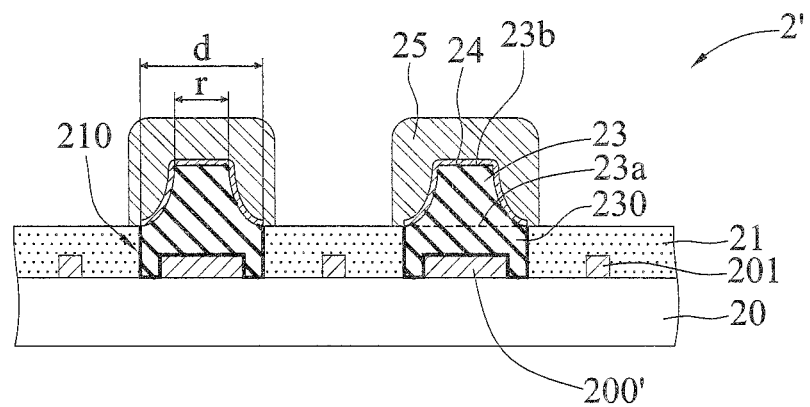

As shown in FIG. 2E, a surface finish layer 24 is formed on the conductive pillars 23 in a subsequent process, and is then covered by a solder material 25.

In an embodiment, a material forming the surface finish layer 24 is one selected from the group consisting of electroplated nickel/gold, electroless plated nickel/gold, electroless nickel immersion gold (ENIG), electroless nickel electroless palladium immersion gold (ENEPIG), immersion tin and organic solderability preservative (OSP).

Moreover, the solder material 25 can be formed by electroplating, electroless plating, hot air solder leveling (HASL), or printing such as stencil printing or dry film printing.

In addition, a surface finish layer 24 or a solder material 25 may also be formed on the metal pillars 26, 26'.

One embodiment, as shown in FIG. 2E', is a subsequent process of FIG. 2A'.

Figure 2F:
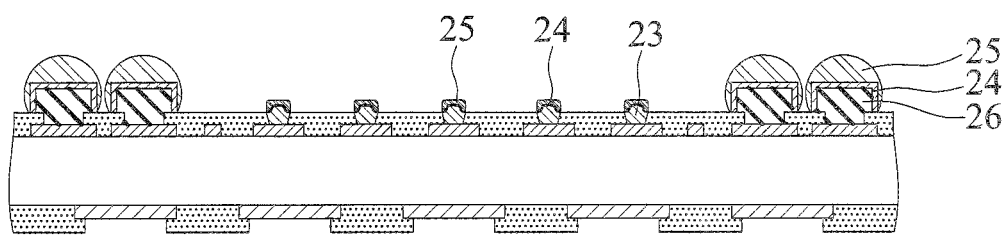
Figure 2F:
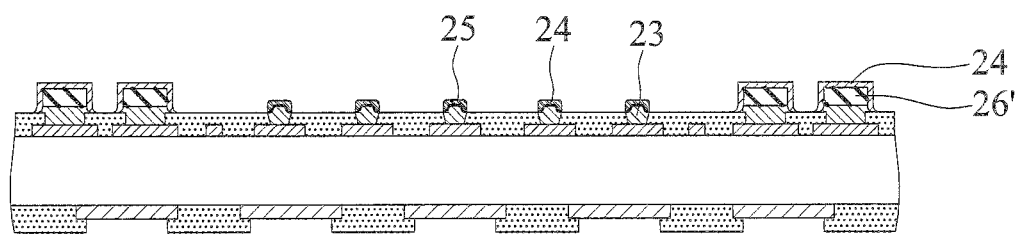

In an embodiment, the surface finish layer 24 is formed both on the metal pillar 26, 26' and the conductive pillar 23, and the surface finish layer 24 both on the conductive pillar 23 and the metal pillar 26, 26' are covered by the solder material 25, as shown in FIG. 2F.

In another embodiment, the surface finish layer 24 is formed both on the metal pillar 26, 26' and the conductive pillar 23, while the solder material 25 is not formed on the surface finish layer 24 on the metal pillar 26, 26', as shown in FIG. 2F'.

In the packaging substrate 2 according to the present invention, metal layer etching is utilized such that the width d of the first end 23a (the lower end) is bigger than the width r of the second end 23b (the upper end) of the conductive pillar 23. Therefore, the conductive pillar does not form a wing structure, and the spacing P' between the solder material 25 can be reduced to be equal to or less than, for example, 130 μm, as shown in FIG. 2E, to satisfy demands for fine-pitch and multi-joints.

Moreover, since the conductive pillar 23 does not form a wing structure, there is no metal material on the insulating protective layer 11 during the performance of temperature cycling test (TCT). The crack is hence avoided. Therefore, the reliability of the packaging substrate 2 is improved, and the successful test of the packaging substrate 2 can be expected.

Furthermore, the conductive pillar 23 forms a cone-shaped structure such that the rim diameter of the opening 210 is equal to the greatest diameter of the conductive pillar 23 (for example, the width d of the first end 23a of the conductive pillar 23) as shown in FIG. 2D. The reliability of the conductive pillar 23 can therefore be enhanced, and a solder ball can be avoided to be left off during the performance of the push-pull bond test for the joint structure consisting of the solder material 25 and the conductive pillar 23.

Compared with the prior copper bump having a wing structure (the structure over an insulating protective layer), the cone-shaped structure of the conductive pillar 23 has more surface areas. Therefore, the adhesion areas of the conductive pillar 23 and the solder material 25 are increased, and the bonding ability between the conductive pillar 23 and the solder material 25 is thus enhanced.

The following first to tenth embodiments are various patterns formed in an metal layer etching process. FIGS. 3A-3E are various patterns of a first embodiment for the packaging substrate according to the present invention.

Figure 3A:
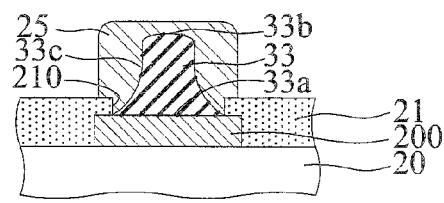
FIGS. 3A-3E are cross-sectional views of various patterns of a first embodiment of a method for fabricating a packaging substrate according to the present invention.

As shown in FIG. 3A, the conductive pad 200 is disposed on the substrate body 20, and the opening 210 of the insulating protective layer 21 exposes a portion of surface of the conductive pad 200 such that the conductive pad 200 is SMD-type. The first end 33a of the conductive pillar 33 is in contact with the conductive pad 200, and the conductive pillar 33 further has a lateral surface 33c between the first end 33a and the second end 33b. The lateral surface 33c is an arced surface such as a concave face, and the solder material 25 covers the conductive pillar 33.

Figure 3B:
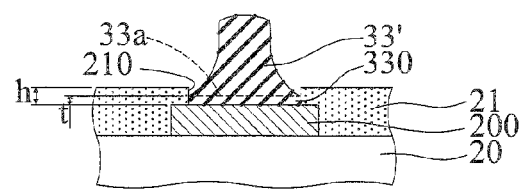

As shown in FIG. 3B, compared with the structure shown in FIG. 3A, the conductive pillar 33' has a seat body 330 in the opening 210. The seat body 330 extends from the first end 33a of the conductive pillar 33' and is in contact with the conductive pad 200, and the height t of the seat body 330 is less than the height h of the opening 210.

Figure 3C:
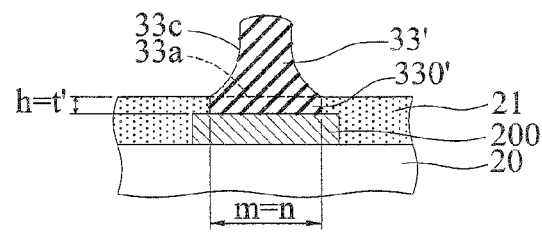

As shown in FIG. 3C, compared with the structure of FIG. 3B, the height t' of the seat body 330' is equal to the height h of the opening 210, and the width m of the seat body 330' is equal to the width n of the first end 33a. In addition, the process of FIG. 3C may refers to the process of FIG. 2D.

Figure 3D:
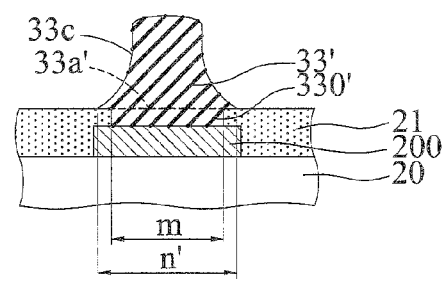

As shown in FIG. 3D, compared with the structure of FIG. 3C, the width m of the seat body 330' is less than the width n' of the first end 33a'. That is, the first end 33a' of the conductive pillar 33' is partially located on the insulating protective layer 21.

Although a portion of the conductive pillar 33' is located on the insulating protective layer 21, the metal material bonded to the surface on the insulating protective layer 21 is not sufficient to influence results of contact pitch, temperature cycling test and push-pull bond test since the conductive pillar 33' has a structure tapered upward.

Figure 3E:
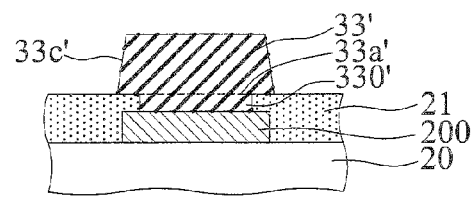

As shown in FIG. 3E, compared with the structure of FIG. 3D, the lateral surface 33c' of the conductive pillar 33' is flat.

In another embodiment similar to those shown in FIGS. 3B-3E, the width of the seat body 330 may be bigger than the width of the first end 33a (not illustrated).

FIGS. 4A-4E show a second embodiment of the packaging substrate of the present invention. The second embodiment differs from the first embodiment in that the conductive pad 400 of the second embodiment is non-solder-mask-defined (NSMD), and the rest structures in FIGS. 4A-4E correspond to the rest structures in FIGS. 3A-3E. The same parts are therefore not specified again.

As shown in FIGS. 4A-4E, the opening 210 of the insulating protective layer 21 exposes the entire surface of the conductive pad 400 and dielectric materials around (as the substrate body 20 surface) such that the conductive pillar 43 (or the seat body 430, 430' of the conductive pillar 43') wraps the conductive pad 400, and the solder material 25 covers the conductive pillar 43'.

FIGS. 5A-5E show a third embodiment of a packaging substrate according to the present invention. The third embodiment differs from the first embodiment in that the conductive pad 500 of the third embodiment is embedded in the substrate body 20 and exposes the end surface thereof on the substrate body 20 surface, and the rest structures (such as the conductive pillar 53, 53') in FIGS. 5A-5E correspond to the rest structures (such as the conductive pillar 33, 33') in FIGS. 3A-3E. The same parts are therefore not specified again.

FIGS. 6A-6E show a fourth embodiment of a packaging substrate according to the present invention. The fourth embodiment differs from the second embodiment in that the conductive pad 600 is embedded in the substrate body 20 and exposes the end surface thereof on the substrate body 20 surface, and the rest structures (such as the conductive pillar 63, 63') in FIGS. 6A-6E correspond to the rest structures (such as the conductive pillar 43, 43') in FIGS. 4A-4E. The same parts are therefore not specified again.

FIGS. 7A-7E show a fifth embodiment of a packaging substrate according to the present invention. The fifth embodiment differs from the second embodiment mainly in that the opening 710 of the fifth embodiment is 'recess'-like so does not penetrate the insulate protection layer 71, and the rest structures (such as the conductive pillar 73, 73') in FIGS. 7A-7E correspond to the rest structures (such as the conductive pillar 43, 43') in FIGS. 4A-4E. The same parts are therefore not specified again.

As shown in FIGS. 7A-7E, the substrate is NSMD design, and the bottom face of the opening 710 of the insulating protective layer 71 is lower than the conductive pad surface 700, a height difference k is therefore generated so that the conductive pad 700 protrudes the bottom face of the opening 710 of the insulating protective layer 71.

FIGS. 8A-8E show a sixth embodiment of a packaging substrate according to the present invention. The sixth embodiment differs from the fifth embodiment in that the bottom face of the opening 810 of the insulating protective layer 81 of the sixth embodiment is flush with the conductive pad surface 800, and the rest structures (such as the conductive pillar 83, 83') in FIGS. 8A-8E correspond to the rest structures (such as the conductive pillar 73, 73') in FIGS. 7A-7E. The same parts are therefore not specified again.

In the first to sixth embodiments, the conductive pillar being higher than the insulating protective layer facilitates the subsequent process of forming the solder material and the promotion of the yield thereof. Preferably, the first end of the conductive pillar is lower than the rim of the opening.

Moreover, the seventh to tenth embodiments may be obtained by incorporating the structure of FIG. 2A' in the first to sixth embodiments.

Figure 4A:
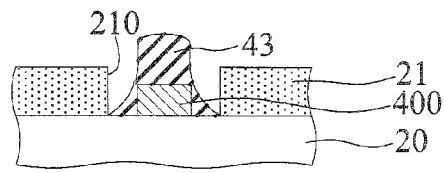
FIGS. 4A-4E are cross-sectional views of patterns of a second embodiment of a method for fabricating a packaging substrate according to the present invention.
Figure 4A:
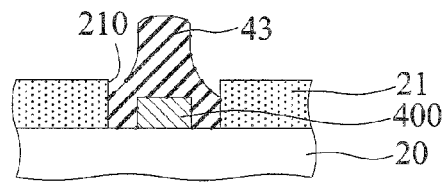

The seventh embodiment corresponds the length Y of the end surface of the conductive pad 200' to the structure of the first embodiment (as FIGS. 3A-3E), and corresponds the width X of the end surface of the conductive pad 200' to the structure of the second embodiment (as FIG. 4A' and FIGS. 4B-4E).

The eighth embodiment corresponds the length Y of the end surface of the conductive pad 200' to the structure of the third embodiment (as FIGS. 5A-5E), and corresponds the width X of the end surface of the conductive pad 200' to the structure of the fourth embodiment (as FIGS. 6A-6E).

The ninth embodiment corresponds the width X of the end surface of the conductive pad 200' to the structure of the fifth embodiment (as FIGS. 7A-7E).

The tenth embodiment corresponds the width X of the end surface of the conductive pad 200' to the structure of the sixth embodiment (as FIGS. 8A-8E).

Therefore, in summary of the first to tenth embodiments, patterns of each embodiment of the present invention may be learned from the following table.

Figure 4B:
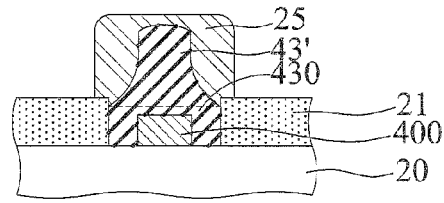
Figure 4C:
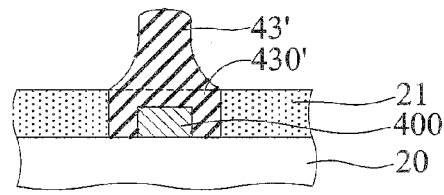
Figure 4D:
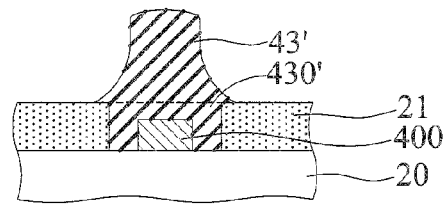
Figure 4E:
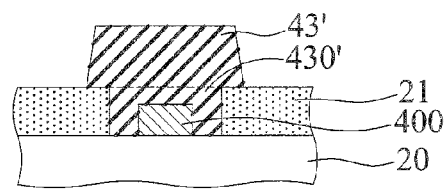
Figure 5A:
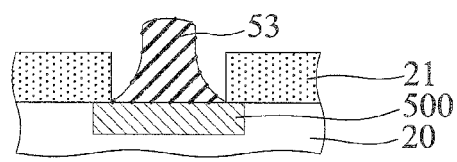
FIGS. 5A-5E are cross-sectional views of patterns of a third embodiment of a method for fabricating a packaging substrate according to the present invention.
Figure 5B:
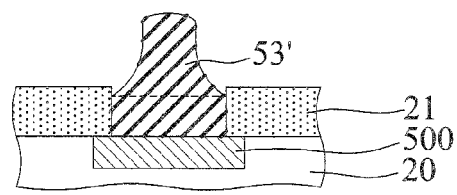
Figure 5C:
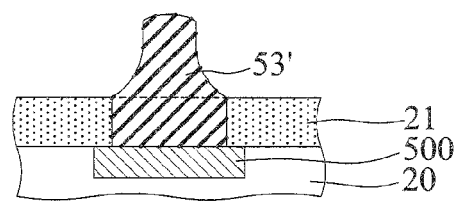
Figure 5D:
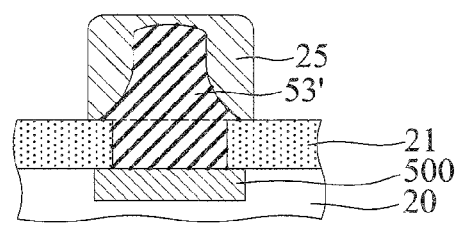
Figure 5E:
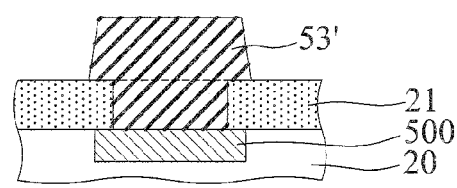
Figure 6A:
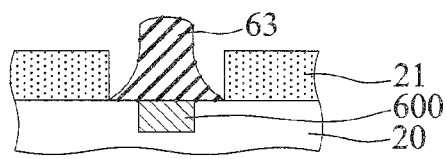
FIGS. 6A-6E are cross-sectional views of patterns of a fourth embodiment of a method for fabricating a packaging substrate according to the present invention.
Figure 6B:
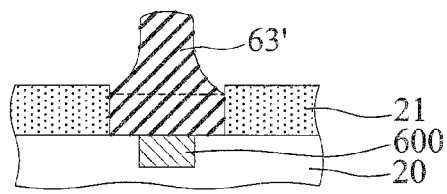
Figure 6C:
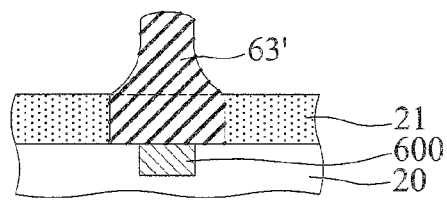
Figure 6D:
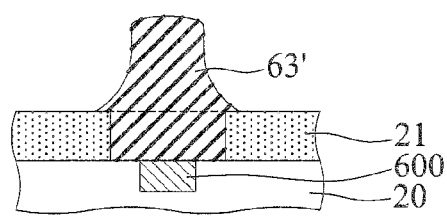
Figure 6E:
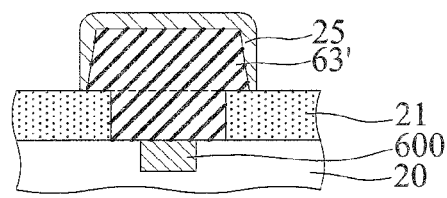
Figure 7A:
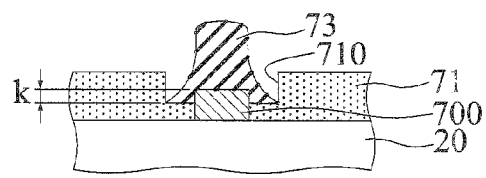
FIGS. 7A-7E are cross-sectional views of patterns of a fifth embodiment of a method for fabricating a packaging substrate according to the present invention.
Figure 7B:
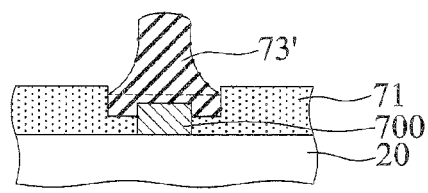
Figure 7C:
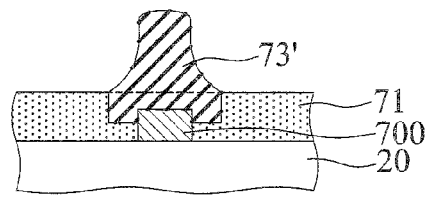
Figure 7D:
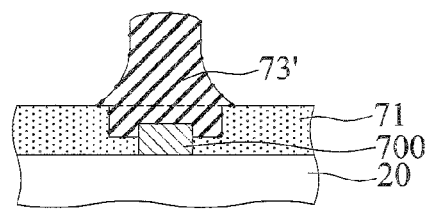
Figure 7E:
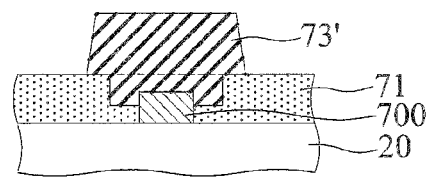
Figure 8A:
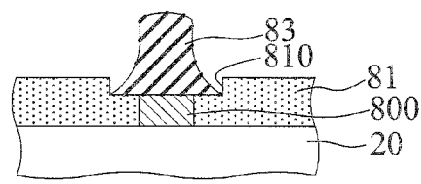
FIGS. 8A-8E are cross-sectional views of patterns of a sixth embodiment of a method for fabricating a packaging substrate according to the present invention.
Figure 8B:
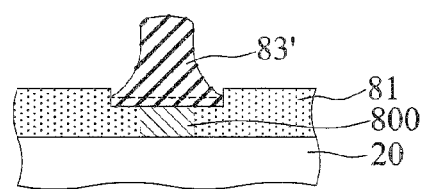
Figure 8C:
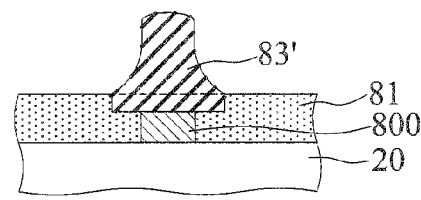
Figure 8D:
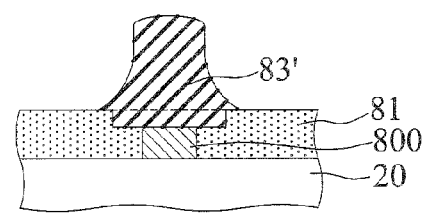
Figure 8E:
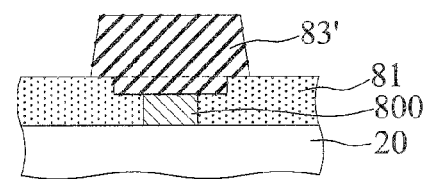

|  | Conductive pillar has no seat body | The surface of the seat body of the conductive pillar is lower than the rim of the opening | The surface of the seat body of the conductive pillar is flush with the rim of the opening | The first end of the conductive pillar is bigger than the width of the seat body (the rim of the opening) | The lateral surface of the conductive pillar is a flat bevel. |
|---|---|---|---|---|---|
| circuit is on the dielectric layer (SMD) | FIG. 3A | FIG. 3B | FIG. 3C | FIG. 3D | FIG. 3E |
| circuit is on the dielectric layer (NSMD) | FIG. 4A | FIG. 4B | FIG. 4C | FIG. 4D | FIG. 4E |
| circuit is buried in the dielectric layer (SMD) | FIG. 5A | FIG. 5B | FIG. 5C | FIG. 5D | FIG. 5E |
| circuit is buried in the dielectric layer (NSMD) | FIG. 6A | FIG. 6B | FIG. 6C | FIG. 6D | FIG. 6E |
| opening bottom is lower than the pad surface (NSMD) | FIG. 7A | FIG. 7B | FIG. 7C | FIG. 7D | FIG. 7E |
| opening bottom is flush with the pad surface (NSMD) | FIG. 8A | FIG. 8B | FIG. 8C | FIG. 8D | FIG. 8E |

The present invention also provides a packaging substrate 2, 2', comprising: a substrate body 20 having a plurality of conductive pads 200, 200' disposed on a surface thereof; an insulating protective layer 21 formed on the substrate body 20; and conductive pillars 23 disposed on surfaces of the conductive pads 200.

The insulating protective layer 21 has a plurality of openings for conductive pads 200, 200' to be exposed therefrom, and the opening 210 is preferably round.

The conductive pillar 23 has the first end 23a opposite to the second end 23b. The first end 23a is closer to the conductive pad 200 than the second end 23b, and the width d of the first end 23a is bigger than the width r of the second end 23b.

In an embodiment, the length Y of the end surface of the conductive pad 200' is bigger than the width X of the end surface of the conductive pad 200' such that the end surface of the conductive pad 200' is preferably oval or rectangular.

In an embodiment, the conductive pad 200, 400 is disposed on a surface of the substrate body 20. Alternately, the conductive pad 500, 600 is embedded in the substrate body 20 to expose the end surface on the surface of the substrate body 20.

In an embodiment, the conductive pad 200 is solder-mask-defined (SMD). Alternately, the conductive pad 500, 600 is non-solder-mask-defined (NSMD).

In an embodiment, the conductive pad 200' performs a non-solder-mask-defined (NSMD) type in the direction of the end surface width, and performs a solder-mask-defined (SMD) type in the direction of the end surface length.

In an embodiment, the conductive pad 700, 800 is located on the substrate body 20, the opening 710, 810 is 'recess'-like so does not penetrate the insulating protective layer 71, 81, and the bottom surface of the opening 710 of the insulating protective layer 71 is lower than the conductive pad surface 700. Alternately, the bottom surface of the opening 810 of the insulating protective layer 81 is flush with the conductive pad surface 800.

In an embodiment, the pillar 23, 33, 33' further has a lateral surface 33c, 33c' between the first end 23a, 33a, 33a' and the second end 23b, 33b, and the lateral surface 33c is an arced surface or a flat surface.

In an embodiment, the first end 33a of the conductive pillar 33 is in contact with the conductive pad 200.

In an embodiment, the conductive pillar 23, 33' further has a seat body 230, 330, 330' in the opening 210. The seat body 230, 330, 330' extends from the first end 23a, 33a, 33a' of the conductive pillar 23, 33' and is in contact with the conductive pad 200.

In an embodiment, the height t of the seat body 330 is less than the rim height h of the opening 210. Alternately, the height t' of the seat body 330' is equal to the rim height h of the opening 210.

In an embodiment, the width m of the seat body 330' is less than the width n of the first end 33a. Alternately, the width m of the seat body 330' is equal to the width n' of the first end 33a', or the width m (not illustrated) of the seat body 330' is bigger than the width of the first end.

In an embodiment, a metal pillars 26, 26' is further disposed on the substrate body 20 to surround the conductive pillars 23. For example, the metal pillar 26' has the first segment 261 and the second segment 262, and the first segment 261 of the metal pillar 26' and the conductive pillar 23 have similar structures.

In summary, the packaging substrate according to the present invention utilizes that the width of the first end is bigger than the width of the second to form a structure without a wing structure to reduce the distance between contact points and satisfy the demands for fine-pitch and multi-joints.

Moreover, since the conductive pillar does not form a wing structure, the crack of the insulating protective layer, while the temperature cycling test is performed, is therefore avoided, and the reliability of the packaging substrate is improved.

Furthermore, the conductive pillar forms a cone-shaped structure such that the diameter of the opening is equal to the width of the first end of the conductive pillar. Therefore the reliability of the conductive pillar can be enhanced to avoid the issue of leaving solder balls.

In addition, the cone-shaped structure of the conductive pillar increases the adhesion areas between the conductive pillar and a solder material to enhance the bonding ability between both two.

The foregoing descriptions of the detailed embodiments are only illustrated to disclose the features and functions according to the present invention and not restrictive of the scope according to the present invention. It should be understood to the in the art that all modifications and variations according to the spirit and principle in the disclosure according to the present invention should fall within the scope of the appended claims.

What is claimed is:

1. A packaging substrate, comprising:
a substrate body having a plurality of conductive pads disposed on a surface thereof;
an insulating protective layer formed on the surface of the substrate body and having openings for the conductive pads to be exposed therefrom; and
conductive pillars disposed on end surfaces of the conductive pads exposed from the openings and having first ends, opposite second ends, and side surfaces adjacent to the first ends and the second ends, the first ends being closer than the second ends from the conductive pads, and the first ends having a width bigger than a width of the second ends, wherein the side surfaces are arc concave toward centers of the conductive pillars.

2. The packaging substrate of claim 1, wherein each of the end surfaces of the conductive pads has a length and a width less than the length.

3. The packaging substrate of claim 2, wherein the end surfaces of the conductive pads are oval or rectangular.

4. The packaging substrate of claim 2, wherein the openings are round and the conductive pads are non-solder-mask-defined (NSMD) in the width direction of the end surfaces thereof, and are solder-mask-defined (SMD) in the length direction of the end surfaces thereof.

5. The packaging substrate of claim 2, wherein the conductive pads are disposed on the surface of the substrate body, or embedded in the substrate body with the end surfaces thereof exposed from the surface of the substrate body.

6. The packaging substrate of claim 2, wherein the conductive pads are disposed on the substrate body, and the openings do not penetrate the insulating protective layer and have bottom surfaces lower than or flushing with the end surfaces of the conductive pads.

7. The packaging substrate of claim 2, wherein the first ends of the conductive pillars are in contact with the conductive pads.

8. The packaging substrate of claim 2, wherein each of the conductive pillars further has a seat body formed in a corresponding one of the openings and extending from the first end of each of the conductive pillars, the seat body has a surface lower than or flushing with a corresponding one of rims of the openings and in contact with a corresponding one of the conductive pads, and the first ends have a width less than, bigger than or equal to a width of the seat body.

9. The packaging substrate of claim 2, wherein the conductive pillars have a flat or arced lateral surface between the first ends and the second ends.

10. The packaging substrate of claim 2, further comprising metal pillars disposed on the substrate body and surrounding the conductive pillars.

11. The packaging substrate of claim 10, wherein each of the metal pillars has a first segment and a second segment, and the first segments of the metal pillars and the conductive pillars have similar structures.

12. The packaging substrate of claim 1, wherein the conductive pads are disposed on the surface of the substrate body, or embedded in the substrate body with the end surfaces thereof exposed from the surface of the substrate body.

13. The packaging substrate of claim 1, wherein the conductive pads are solder-mask-defined (SMD) or non-solder-mask-defined (NSMD).

14. The packaging substrate of claim 1, wherein the conductive pads are disposed on the substrate body, and the openings do not penetrate the insulating protective layer and have bottom surfaces lower than or flushing with the end surfaces of the conductive pads.

15. The packaging substrate of claim 1, wherein the first ends of the conductive pillars are in contact with the conductive pads.

16. The packaging substrate of claim 1, wherein each of the conductive pillars has a seat body formed in a corresponding one of the openings and extending from the first end of each of the conductive pillars, the seat body is in contact with the conductive pads and has a surface lower than or flushing with a rim of the corresponding one of the openings, and the first ends have a width less than, bigger than or equal to a width of the seat body.

17. The packaging substrate of claim 1, wherein each of the conductive pillars has a flat or arced lateral surface between the first end and the second end.

18. The packaging substrate of claim 1, further comprising metal pillars disposed on the substrate body and surrounding the conductive pillars.

19. The packaging substrate of claim 18, wherein each of the metal pillars has a first segment and a second segment, and the first segments of the metal pillars and the conductive pillars have similar structures.

* * * * *